US005991149A

United States Patent [19]

Tsuneaki et al.

[11] Patent Number: 5,991,149

[45] Date of Patent: Nov. 23, 1999

[54] OPERATION SHAFT RECEIVING-TYPE ELECTRIC

[75] Inventors: Tadayoshi Tsuneaki; Masahide Kanagawa, both of Osawano-machi, Japan

[73] Assignee: Hokuriku Electric Industry Co., Ltd., Toyama Pref., Japan

[21] Appl. No.: 09/197,861

[22] Filed: Nov. 23, 1998

[30] Foreign Application Priority Data

Oct. 16, 1998 [JP] Japan .................................. 10-295487

[51] Int. Cl.[6] ...................................................... H05K 7/00

[52] U.S. Cl. .......................... 361/629; 361/628; 361/630; 338/164; 338/184; 338/334; 200/4; 200/524; 439/83

[58] Field of Search .................................... 361/610–632; 200/4, 11 R, 11 J, 14, 17 R, 18, 155–160, 318, 322–325, 327, 328–330, 337–340, 301, 38 E, 523, 524; 338/128–131, 162, 164, 184, 199, 334, 172, 179, 198, 200, 215; 439/83

[56] References Cited

U.S. PATENT DOCUMENTS

| | | | |
|---|---|---|---|
| 3,927,276 | 12/1975 | Lipp | 200/4 |
| 4,365,231 | 12/1982 | Nishioka | 338/334 |
| 5,432,312 | 7/1995 | Otani et al. | 200/524 |
| 5,711,680 | 1/1998 | Tsuneaki et al. . | |

FOREIGN PATENT DOCUMENTS

| | | |
|---|---|---|
| 55-15741 | 7/1978 | Japan . |
| 60-52563 | 5/1980 | Japan . |
| 6-33621 | 6/1987 | Japan . |
| 5-54757 | 3/1991 | Japan . |
| 7-85442 | 7/1995 | Japan . |
| 10-41107 | 5/1996 | Japan . |

*Primary Examiner*—Leo P. Picard
*Assistant Examiner*—Michael Datskovsky
*Attorney, Agent, or Firm*—Pearne, Gordon, McCoy & Granger LLP

[57] ABSTRACT

An operation shaft receiving-type electric component capable of reducing the number of parts required therefor and preventing generation of noise. An electric component body which includes an electric component unit varied in electric properties due to a variation in rotation angle of the operation shaft is arranged between an operation section of an operation shaft and a mechanism unit. A push-type lock and release mechanism is constituted by a guide member held stationary, both a slider member and a rotary slider each rotatably fitted on the operation shaft, a spring holder and a spring member. The guide member is provided with a plurality of primary guide grooves and secondary guide grooves, in which projections of the slide member are fitted, respectively. The rotary slider is provided with a plurality of projections, which are fitted in the main guide grooves, respectively. The guide member and each of the projections of the rotary slider are provided with a guide surface and a contact surface, respectively, which cooperate with each other to successively rotate the rotary slide by a predetermined rotation angle.

21 Claims, 8 Drawing Sheets

OPERATION SHAFT RECEIVING-TYPE ELECTRIC

BACKGROUND OF THE INVENTION

This invention relates to an electric component of the operation shaft receiving type, and more particularly to an operation shaft receiving-type electric component including an electric component unit wherein application of pressing force to an operation shaft of which an operation section is at a first position or received position to displace the operation section toward a second position or receiving position renders the operation shaft locked, application of pressing force to the operation section kept at the second position renders the operation section returned to the first position and displacement of the operation section leads to a variation in electric properties of the electric component unit.

A basic or principal structure of a push rod mechanism for a typical operation shaft employed in a conventional operation shaft receiving-type electric component is disclosed in Japanese Utility Model Application No. 98724/1978 (Laid-Open Publication No. 15741/1980). Such a push rod mechanism is referred herein to as "push-type lock and release mechanism". Also, an improvement in such a push-type lock and release mechanism is disclosed in Japanese Patent Application Laid-Open Publication No. 54757/1993, Japanese Utility Model Publication No. 33621/1994, Japanese Patent Publication No. 85442/1995, Japanese Patent Publication No. 52563/1985 and the like. Such a push-type lock and release mechanism is typically constructed so as to move a pin in a cam groove of a heart-like shape. Unfortunately, the conventional push-type lock and release mechanism is complicated in structure and relatively highly deteriorated in operability due to wear of various parts thereof.

In view of the above, an operation shaft receiving-type electric component including a novel push-type lock and release mechanism intended to solve the above-described problem of the conventional typical push-type lock and release mechanism is proposed as disclosed in Japanese Patent Application Laid-Open Publication No. 41107/1998. The novel push-type lock and release mechanism proposed is advantageous in that it is simplified in structure and substantially prevents wear of various parts thereof from adversely affecting operability thereof.

The operation shaft receiving-type electric component proposed in Japanese Patent Application Laid-Open Publication No. 41107/1998 is constructed so as to arrange a push-type lock and release mechanism between an operation section of an operation shaft and an electric component unit. The operation shaft receiving-type electric component is mounted on a circuit board so that the electric component unit is positioned on the circuit board. Unfortunately, this fails to permit the electric component to be mounted on the circuit board while keeping a body of the electric component inserted through the circuit board for mounting as in a socket-type electric component disclosed in U.S. Pat. No. 5,711,680.

Also, the operation shaft receiving-type electric component proposed in Japanese Patent Application Laid-Open Publication No. 41107/1998 causes an increase in the number of parts required because the push-type lock and release mechanism requires a couple of springs. Further, in the operation shaft receiving-type electric component proposed in Japanese Patent Application Laid-Open Publication No. 41107/1998, the push-type lock and release mechanism employs a rotational top or a member designated at reference numeral 29 in FIG. 1 of the publication, which is normally fitted in a hole 26 of a cross-like shape formed in a cylinder of a rotator 23 for rotating a contact section of the electric component unit. Such construction causes vibration occurring every time when the rotational top is released from the hole for rotation to be transmitted directly to the rotator. The vibration thus transmitted leads to vibration of the contact section, resulting in noise being possibly generated. In addition, the structure disclosed in the publication often fails to render the operation shaft locked when the operation section is rotated in a direction of rotation of the rotational top while being pushed or forced for locking of the operation shaft. Also, rotation of the operation section in the direction in which the rotational top is rotated while pushing the operation section for the purpose of releasing the lock causes a problem of failing in release of the lock. Such problems are due to rotation of the rotator formed with the cross hole.

SUMMARY OF THE INVENTION

The present invention has been made in view of the foregoing disadvantage of the prior art.

Accordingly, it is an object of the present invention to provide an operation shaft receiving-type electric component including a push-type lock and release mechanism which is capable of reducing the number of parts required therefor and being simplified in structure.

It is another object of the present invention to provide an operation shaft receiving-type electric component which is capable of substantially preventing or minimizing generation of noise.

It is a further object of the present invention to provide an operation shaft receiving-type electric component which is capable of ensuring positive lock and release operation.

It is still another object of the present invention to provide an operation shaft receiving-type electric component which is capable of facilitating assembling thereof.

It is yet another object of the present invention to provide an operation shaft receiving-type electric component which is capable of being small-sized.

It is a still further object of the present invention to provide an operation shaft receiving-type electric component which is capable of reducing frictional resistance at contact sections to ensure smooth operation thereof.

In accordance with the present invention, an operation shaft receiving-type electric component is provided. The operation shaft receiving-type electric component generally includes an operation shaft having a first end or an end defined on a forward side of an axial direction thereof and a second end or an end defined on a rearward side of the axial direction and including an operation section provided on a side of the first end, an electric component body arranged between the operation section and the second end of the operation shaft and including a casing in which an electric component unit varied in electric properties due to displacement of the operation shaft is received, and a push-type lock and release mechanism provided with respect to the second end of the operation shaft projected from the casing of the electric component body. The term "forward side of axial direction" referred to herein indicates a side of the axial direction of the operation shaft on which the operation shaft is arranged. The term "rearward side of axial direction" used herein means the other side of the axial direction of the operation shaft opposite to the forward side or a side of the axial direction on which the operation shaft is not arranged.

The push-type lock and release mechanism is arranged so as to keep the second end of the operation shaft locked when force acting to move the operation section of the operation shaft from a first position away toward the forward side of the axial direction from the casing to a second position in proximity to the casing is applied to the operation section of the operation shaft to move the operation shaft toward the rearward side of the axial direction, followed by release of the force and so as to release the lock of the second end of the operation shaft when force acting to move the operation section of the operation shaft locked to the second position is applied to the operation section of the operation shaft, followed by release of the force.

More specifically, the electric component body may be fitted between the operation section and the second end of the operation shaft and includes the casing, a rotor arranged in the casing so as to be rotated with the operation shaft and permit the operation shaft to be moved in the axial direction, a rotor support arranged in the casing so as to rotatably support the rotor, and the electric component unit including a rotated member and arranged in the casing. The rotated member is rotated by rotation of the rotor, leading to a variation in electric properties of the electric component unit. The electric component units include a variable resistor, a potentiometer, a push switch, a rotary switch, a variable capacitor and the like. The electric component body may be provided therein with two or more electric component units. Also, a switch unit which is subject to on-off operation depending on movement of the operation shaft in the axial direction thereof may be arranged in the electric component body.

The push-type lock and release mechanism includes a guide member, a slide member, a rotary slider, a detachment preventing member and a spring member. Actually, the push-type lock and release mechanism is arranged in a cover member fixed on the casing of the electric component body.

The guide member is held stationary while being arranged concentrically with the operation shaft. In a preferred embodiment of the present invention, it may be held stationary with respect to the casing of the electric component body. The term "the guide member is held stationary" means that the guide member is held immovable in spite of movement of the parts such as the operation shaft, the rotary slider or the like. The guide member includes primary guide grooves of n (n: an integer of 2 or more) in number arranged in a manner to extend in parallel to an axis of the operation shaft, be spaced from each other at equal intervals in a peripheral or circumferential direction of the operation shaft while surrounding the operation shaft and be open to both the operation shaft and the rearward side of the axial direction thereof, secondary guide grooves of n in number arranged so as to be positioned between each adjacent two of the primary guide grooves, extend in parallel to the axis of the operation shaft, be spaced at equal intervals from each other in the circumferential direction and be open to both the operation shaft and the rearward side of the axial direction, and a plurality of guide surfaces formed on an end thereof defined on the rearward side of the axial direction in a manner to be positioned between the primary guide grooves adjacent to each other. The guide member may be formed into a complete cylindrical shape. Alternatively, it may be constructed so as to include a plurality of elongated openings wherein the primary guide grooves are open outwardly in a radial direction of the operation shaft.

The guide surfaces include a first surface formed so as to be contiguous to an opening of one of adjacent two of the primary guide grooves which is defined on the rearward side of the axial direction and formed so as to be inclined from a side thereof facing the one of the adjacent two primary guide grooves to a side thereof facing the other of the adjacent two primary guide grooves while extending toward the forward side of the axial direction, resulting in having a terminal end defined at an edge of the secondary groove positioned at a side of the other of the adjacent two primary guide grooves, a second surface formed so as to extend from the terminal end of the first surface toward the rearward side of the axial direction and have an initial end defined on a side of the terminal end of the first surface and a terminal end defined opposite to the initial end, and a third surface formed so as to be inclined from the terminal end of the second surface toward the other of the adjacent two primary guide grooves while extending toward the forward side of the axial direction and so as to be contiguous to an opening of the other of the two primary guide grooves.

When the cover member is arranged, the guide member is preferably provided separately from the cover member. Such construction not only permits the cover member to be integrally formed, but facilitates formation of the guide member. In this instance, the guide member is provided with a flange which is interposedly supported between the casing of the electric component body and the cover member. The flange permits the guide member to be readily fixed on the casing. Concurrently with such fixing of the cover member, the guide member may be fixed on the casing.

The slide member is provided with projections of 2n in number fitted in the primary guide grooves and secondary guide grooves and is fitted in the guide member so as to be movable in the axial direction, resulting in being movable with the operation shaft in the axial direction. Also, the slide member is formed on an end surface thereof defined on the rearward side of the axial direction with an annular rugged surface section constituted by protrusions of 2n in number and recesses of 2n in number alternately arranged at predetermined angular intervals. The protrusions are arranged so as to be positioned on the projections and include inclined surfaces. When the electric component unit is a push switch or a linear slide-type variable resistor, the slide member may be provided integrally with the operation shaft. However, when the operation shaft is rotated, it is not possible to render the slide member and operation shaft integral with each other. Integration between the slide member and the operation shaft requires to increase a diameter of the operation shaft. Otherwise, the slide member fails to be increased in size and assembling of the electric component is rendered troublesome. Further, this causes shock due to rotation of the rotary slider to be readily transmitted to the operation shaft.

The slide member is preferably provided separately from the operation shaft even when it is not required to rotate the operation shaft. In this instance, the slide member is formed with a through-hole via which the end of the operation shaft on the rearward side of the axial direction or the second end of the operation shaft is pivotally inserted. Then, the slide member is loosely fitted on the operation shaft. This permits the slide member to be pivotally moved by a slight amount about the operation shaft, to thereby minimize transmission of vibration due to rotation of the rotary slider to the operation shaft. For this purpose, for example, the present invention may be constructed in such a manner that the operation shaft is formed at a first portion thereof on which the slide member is fitted into a diameter smaller than that of a second portion thereof positioned forwardly of the first portion in the axial direction and the second portion has an end surface positioned on the rearward side of the axial direction wherein the end surface of the second portion constitutes a stopper surface contacted with an end surface of the slide member defined on the forward side of the axial direction. This permits the slide member to be moved with the operation shaft even when the slide member is loosely fitted on the operation shaft.

The rotary slider is provided with projections of n in number fitted in the guide grooves and arranged on the rearward side of the axial direction of the operation shaft based on the slide member so as to be pivotally fitted on the second end of the operation shaft. The projections of the rotary slider each are formed on an end surface thereof defined on the forward side of the axial direction with a contact surface section contacted with the rugged surface section of the slide member. The contact surface section is inclined so as to extend toward the forward side of the axial direction of the operation shaft while extending toward one side of the circumferential direction of the operation shaft or a direction of rotation of the rotary slider.

The detachment preventing member is arranged on the rearward side of the operation shaft based on the rotary slider and fixed on the second end of the operation shaft, resulting in preventing detachment of the rotary slider from the operation shaft. The spring member is arranged so as to constantly generate force acting to urge the rotary slider against the slide member and compressed to store the force when the operation section of the operation shaft is moved from the first position to the second position. More specifically, the second end of the operation shaft is fitted on a distal portion thereof with a spring holder on which the spring holder is held at one end thereof and the spring holder is contacted with an end surface of the rotary slider defined on the rearward side of the axial direction, to thereby permit rotation of the rotary slider. The spring holder prevents the spring member from interfering with rotation of the rotary slider. Also, the spring holder may be formed at an end thereof facing the rotary slider with a recess in which the detachment preventing member is received. Such construction effectively prevents an increase in length of the electric component in the axial direction due to arrangement of the spring holder. Also, it keeps the detachment preventing member from being contacted with the rotary slider, to thereby prevent the detachment preventing member from interfering with rotation of the rotary slider.

The spring member is preferably constituted by a coiled spring formed into a diameter which permits one end thereof defined on a side of the spring holder to enter the guide member together with the spring holder when the operation section is at the first position. The cover member is formed therein with a receiving section for receiving the other end of the spring member therein so as to restrain movement of the other end of the spring member. Such construction highly facilitates assembling of the electric component and prevents dislocation of the spring member after the assembling.

The projections of the rotary slider, the contact surface sections of the projections, and the protrusions and recesses of the rugged surface section of the slide member each are formed into a configuration which is determined so as to permit locking force which acts to move the operation section of the operation shaft from the first position to the second position to be applied to the operation section of the operation shaft, during which the contact surface section and one of two inclined surfaces of the protrusion on the projection fitted in each of the primary guide grooves are kept contacted with each other while the projections are positioned in the primary guide grooves, the contact surface section is partially moved from the inclined surface of the protrusion onto the first surface of the guide member after the projection is moved out of the primary guide groove, and the contact surface section is slid on the first surface of the guide member to engage the projection with the second surface when the locking force is released. The configuration is also determined so as to permit release force which acts to urge the operation section of the operation shaft toward the second position to be applied to the operation section of the operation shaft, during which the projection is engaged with the second surface of the guide member and the contact surface section is contacted with the inclined surface of the protrusion of the projection fitted in the secondary guide groove, the contact surface section is partially shifted from the inclined surface of the protrusion onto the third surface after the projection is moved to a position at which engagement between the projection and the second surface of the guide member is released, and the contact surface section is slid on the third surface of the guide member, to thereby permit the projection to enter the primary guide groove adjacent in the circumferential direction when the release force is released.

When the protrusions each are formed into a triangular shape in section, the inclined surface of the protrusion positioned in the direction of rotation of the rotary slider or on one side of the circumferential direction of the operation shaft is contacted with the contact surface section during movement of the contact surface section to the first surface or third surface.

Thus, the configuration is further determined so that the contact surface section gets over the other inclined surface of the protrusion on the other side of the circumferential direction of the protrusion of the projection fitted in the secondary guide groove, to thereby be contacted with the one inclined surface in the course of engagement of the projection with the second surface of the guide member and the contact surface section gets over the other inclined surface of the protrusion on the other side of the circumferential direction of the protrusion of the projection fitted in the primary guide groove, to thereby be contacted with the one inclined surface in the course of fitting of the projection in another one of the primary guide grooves. Formation of the protrusion into an equilateral triangle in section renders operation of the electric component stable and ensures smooth rotation of the rotary slider.

Thus, the present invention is constructed so as to permit the single spring member to attain both lock operation and release operation, resulting in reducing the number of parts required and simplifying a structure of the electric component. Also, in the present invention, the rotary slider is held stationary, to thereby prevent shock due to rotation of the rotary slider from being transmitted directly to contacts of the electric component unit through the guide member. In addition, the present invention is so constructed that the guide member is held stationary and the operation shaft is pivotally moved with respect to the slide member and rotary slider. This prevents application of rotating force to the operation section during lock operation or release operation from affecting both lock operation and release operation, to thereby ensure satisfactory lock and release of the operation shaft.

BRIEF DESCRIPTION OF THE PREFERRED EMBODIMENTS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, an operation shaft receiving-type electric component according to the present invention will be described hereinafter with reference to the accompanying drawings.

Figure 1A:
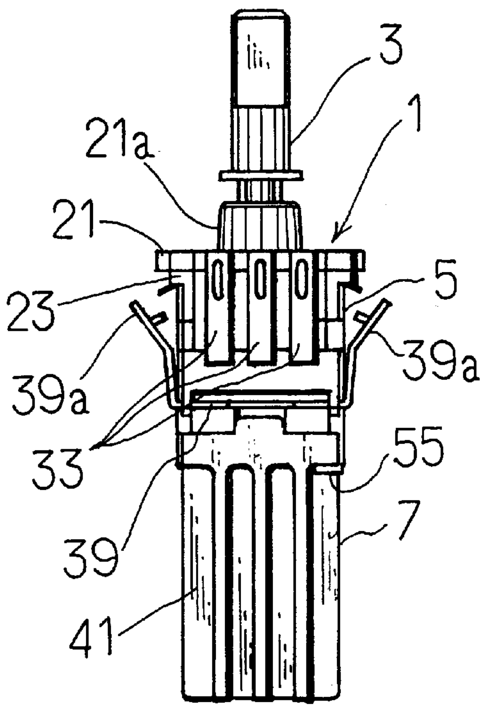
FIG. 1A is a front elevation view showing an embodiment of an operation shaft receiving-type electric component according to the present invention, which includes a variable resistor provided with a click feeling producing mechanism.
Figure 1B:
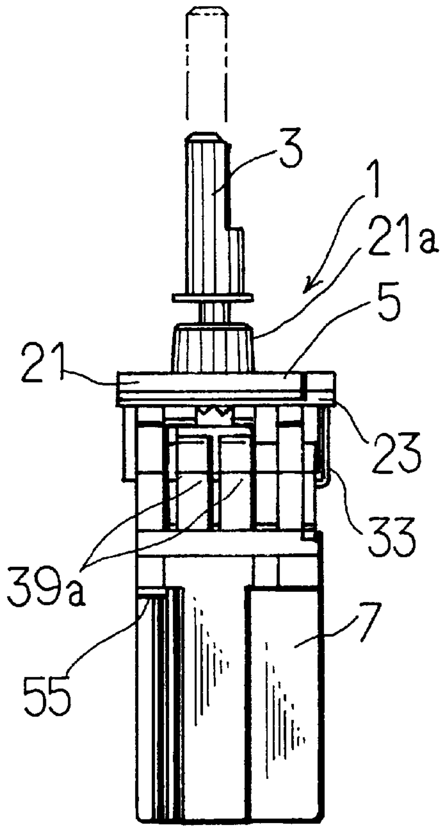
FIG. 1B is a left side elevation view of the operation shaft receiving-type electric component shown in FIG. 1A.
Figure 1C:
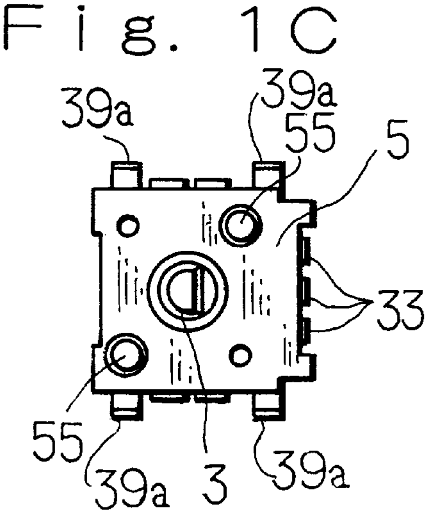
FIG. 1C is a right side elevation view of the operation shaft receiving-type electric component shown in FIG. 1A.
Figure 2:
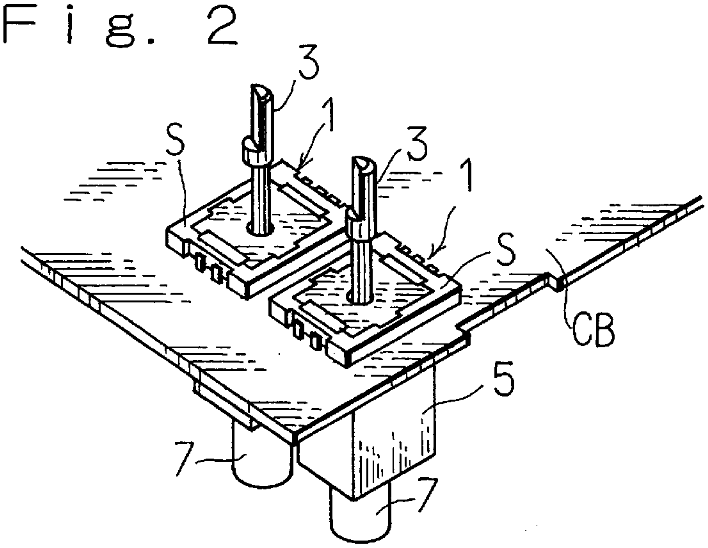
FIG. 2 is a fragmentary perspective view showing arrangement of two operation shaft receiving-type electric components of FIG. 1A on a circuit board.
Figure 3:
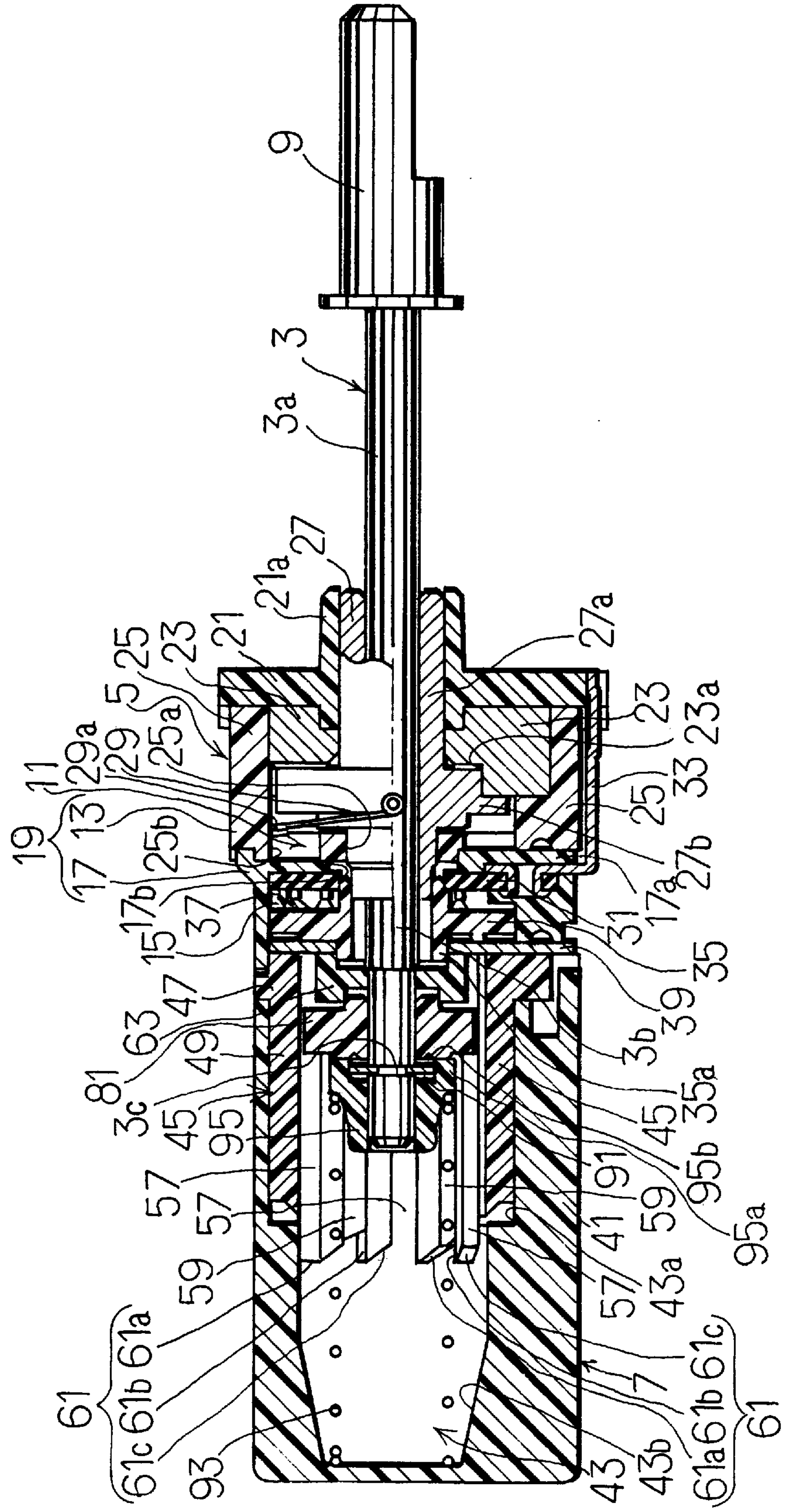
FIG. 3 is a sectional view of the operation shaft receiving-type electric component shown in FIG. 1A, which does not have an operation shaft received therein.
Figure 4:
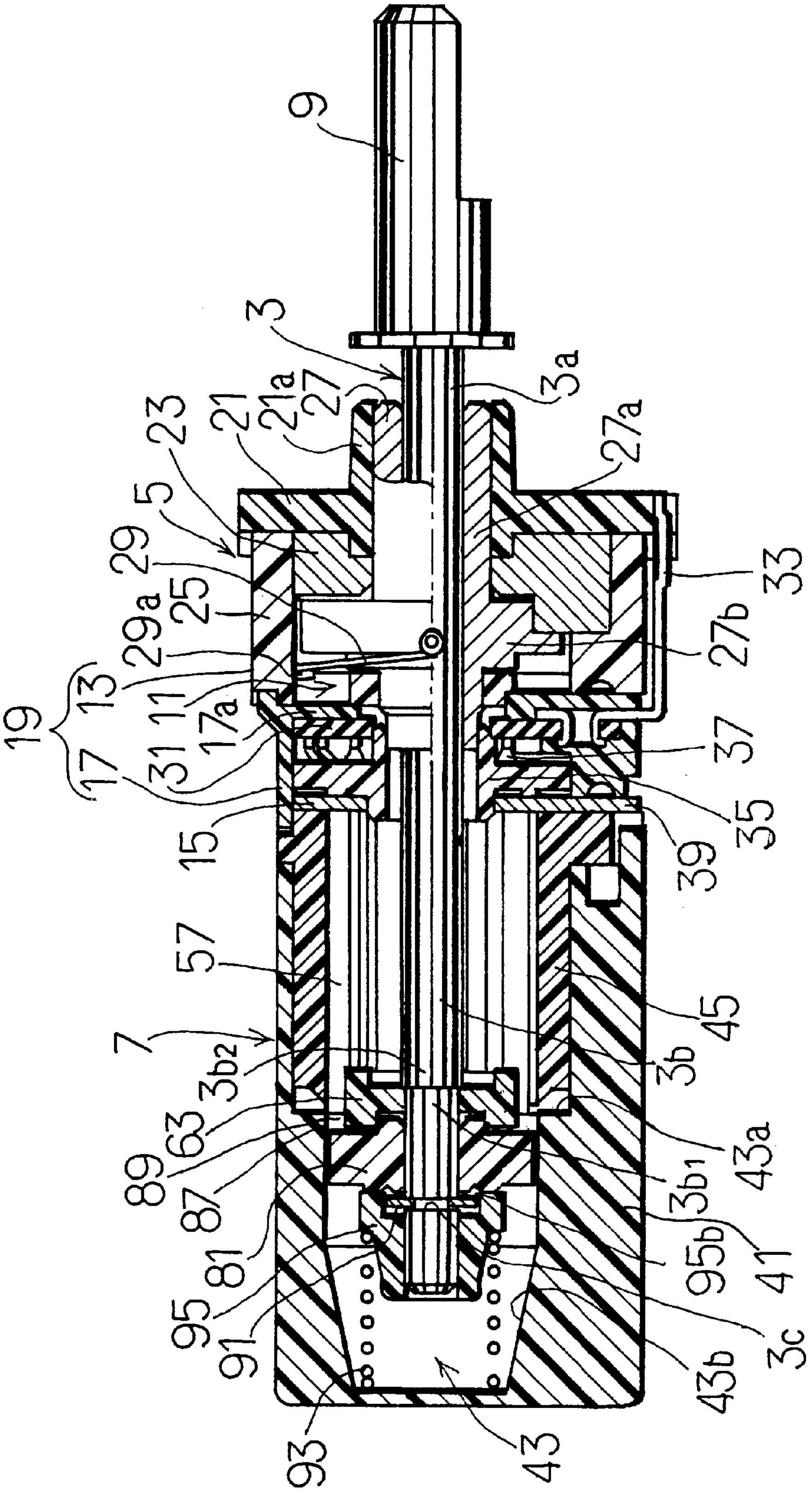
FIG. 4 is a sectional view of the operation shaft receiving-type electric component shown in FIG. 1A, which has an operation shaft received therein.

Referring first to FIGS. 1A to 4, an embodiment of an operation shaft receiving-type electric component according to the present invention is illustrated, which includes a variable resistor provided with a click feeling producing mechanism. In FIGS. 1A to 1C, an operation shaft receiving-type electric component of the illustrated embodiment is generally designated at reference numeral 1, in which an operation shaft 3 is kept received. The operation shaft receiving-type electric component 1 is adapted to be mounted on a socket provided on a circuit board as in a socket mounted-type mechanism electric component disclosed in U.S. Pat. No. 5,711,680. FIG. 2 shows mounting of two such socket mounted-type operation shaft receiving-type electric components 1 on a circuit board CB. Reference numeral 5 designates an electric component body and 7 is a mechanism unit in which a push-type lock and release mechanism is received. Reference character S designates a socket. In FIG. 3, the operation shaft 3 is kept from being received in the electric component body 5. More specifically, an operation section 9 integrally provided on one side or a forward side of the operation shaft 3 in an axial direction thereof is kept at an operation position or a first position. In FIG. 4, the operation shaft 3 is kept received therein or the operation section 9 of the operation shaft 3 is kept at a received position or a second position.

Now, the electric component body 5 will be described with reference to FIGS. 3 and 4. The operation shaft 3 includes a first section 3*a* arranged so as to continuously extend from the operation section 9 toward the other side or a rearward side thereof in the axial direction thereof and formed into a non-circular shape in cross section taken in a direction perpendicular to an axis of the operation shaft 3 and a second section 3*b* arranged so as to continuously extend outwardly from the first section 3*a* and formed into a circular shape in cross section taken in a direction perpendicular to the axis thereof. The electric component body 5 includes a casing 19 constituted of a first casing member 13 in which a click feeling producing mechanism 11 is received and a second casing member 17 in which a variable resistor unit or rotary electric component unit 15 is received. The first casing member 13 includes a top plate 21 made of an insulating resin material and including a bushing 21*a* of a cylindrical shape constituting a rotor support structure for rotatably supporting a rotor 27 therein, an electrically conductive base member 23 made of aluminum by die casting, and a frame 25 made of a synthetic resin material and fitted on the base member 23. The base member 23 is provided with a pair of flanges in a manner to be integral therewith, which are contacted with a ground electrode on a front surface of the circuit board CB shown in FIG. 2.

The rotor 27 is integrally made of metal. The rotor 27 is rotatably supported at one end or a forward end thereof in the bushing 21*a* and provided on the other end or a rearward end thereof with a cylindrical section 27*a* rotatably fitted in a through-hole 25*a* formed via a bottom wall of the frame 25 and a fitted section 27*b* rotatably fitted in a fit recess 23*a* formed in the base member 23. Reference numeral 29 designates a leaf spring member formed into an arcuate shape and functioning to produce a click feeling. The leaf spring member 29 is fixed at both ends thereof on the fitted section 27*b* in a manner to be pivotable. The leaf spring member 29 is formed at a central portion thereof with a projection 29*a,* which is fitted in a hole 25*b* formed at the bottom wall of the frame 25, to thereby provide a click feeling.

In the operation shaft receiving-type electric component 1 of the illustrated embodiment, static electricity introduced through the operation shaft 3 into the first casing member 13 then flows through the operation shaft 3, rotor 27 and base member 23 to a ground of the circuit board CB. This prevents static electricity from flowing to the electric component unit received in the second casing member 17.

The second casing member 17 in which the variable resistor mechanism is received includes a wall 17*a* arranged adjacently to the first casing member 13. The wall 17*a* of the second casing member 17 is formed at a central portion thereof with a through-hole 17*b* through which the cylindrical section 27*a* of the rotor 27 is inserted at a rearward end thereof. The wall 17*a* of the second casing member 17 is fixedly mounted thereon with a circuit board 31 which is provided on a front surface thereof with a variable resistance circuit pattern and an output circuit pattern. The circuit board 31 has three terminal fitments 33 fixed thereon through an end thereof. The terminal fitments 33 are connected to the circuit patterns on the circuit board 31. The second casing member 17 is formed of a synthetic resin material by insert molding using the circuit board 31 and a part of the terminal fitments 33 as an insert. The rotor 27 rotatably inserted through the circuit board 31 is fitted on a rearward end thereof with a forward end of a cylindrical section 35*a* of a slider fixing member 35. The slider fixing member 35 has a conductive slider 37 fixed thereon, which includes a plurality of contacts contacted with the variable resistor circuit pattern and a contact pattern on the front surface of the circuit board 31. The slider fixing member 35 includes a cylindrical section 35*a,* which is so arranged that a rearward end thereof is rotatably inserted through an arm mounting plate 39 made of metal and integrally provided with four mounting arms 39*a* (FIG. 1). The arm mounting plate 39 is fitted in a rearward end of the second casing member 17. Relationship among the terminal fitments 33, the mounting arms 39*a* and a socket S (FIG. 2) is detailedly described in U.S. Pat. No. 5,711,680.

Figure 5:
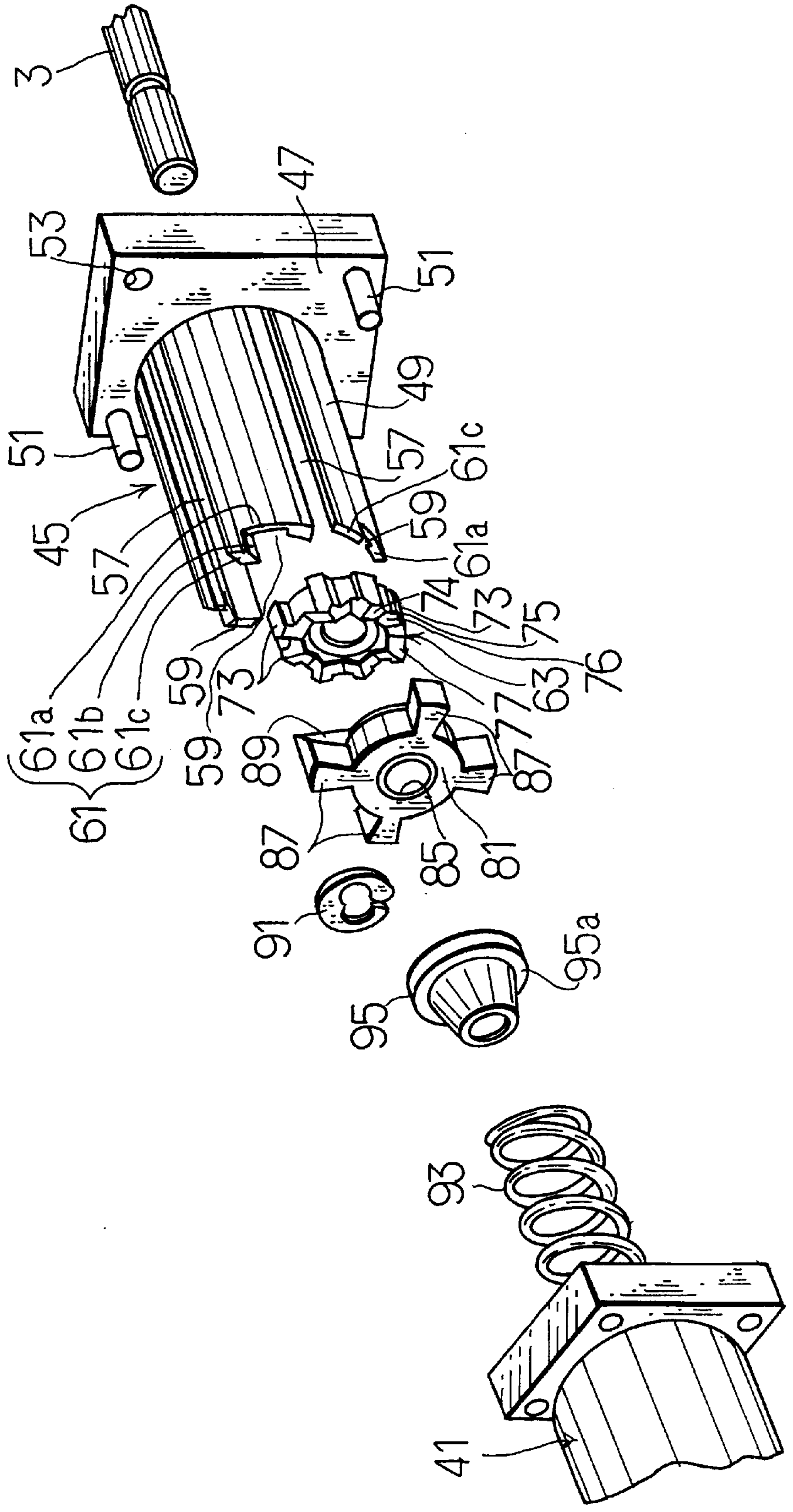
FIG. 5 is a schematic exploded perspective view showing a push-type lock and release mechanism unit.

Now, the mechanism unit 7 in which the push-type lock and release mechanism is received will be described with reference to FIGS. 3 to 5. Reference numeral 41 designates a cover member made of a synthetic resin material. The cover member 41 is formed therein with a receiving space 43 in a manner to be open on a forward side thereof or a side thereof defined on a side of the operation section 9. The receiving space 43 includes a first receiving section 43*a* in which a guide member 45 is received and a second receiving section 43*b* in which a rearward end of a spring member 93 is received. The second receiving section 43*b* is formed into a configuration which restrains movement of the spring member 93.

Figure 6A:
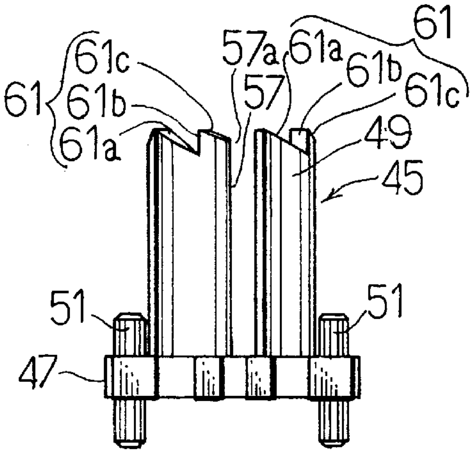
FIG. 6A is a front elevation view showing a guide member.
Figure 6B:
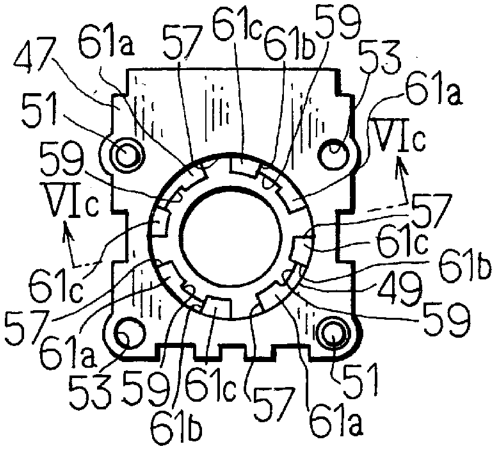
FIG. 6B is a plan view of the guide member shown in FIG. 6A.
Figure 6C:
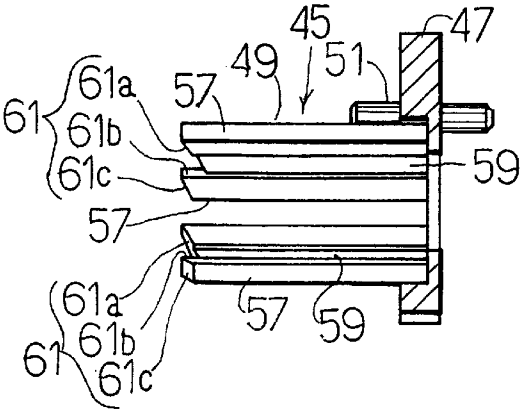
FIG. 6C is a sectional view taken along line VIC—VIC of FIG. 6B.

The guide member 45 is integrally formed of a synthetic resin material and held fixed or stationary with respect to the casing 19 or cover member 41 while being arranged concentrically with the operation shaft 3. This keeps the guide member 45 immovable in spite of movement of the operation shaft 3, rotary slider 81 or the like. The guide member 45, as shown in FIGS. 6A to 6C, includes a flange section 47 and a guide body 49 of a cylindrical shape. The flange 47 is integrally provided at one pair of corners thereof diagonally opposite to each other with fit projections 51. The second casing member 17 and cover member 41 shown in FIGS. 3 and 4 each are formed with fit holes in which the fit projections 51 of the flange 47 are fitted. The flange 47 is formed at the other pair of corners thereof diagonally opposite to each other with through-holes 53. The guide member 45 is interposedly supported between a flange of the cover member 41 and the rearward end of the second casing member 17 together with the arm mounting plate 39. The first casing member 13 and second casing member 17 and the cover member 41 and guide member 45 are coupled to each other by means of two pins 55 (FIG. 1) arranged so as to be inserted therethrough, respectively. The pins 55 are arranged so as to be inserted via the through-holes 53, respectively. Such coupling by means of the pins 55 is detailedly described in U.S. Pat. No. 5,711,680.

The guide body 49 of the guide member 45 is formed with four primary guide grooves 57 in a manner to extend in parallel to the axis of the operation shaft 3 and be spaced from each other at equal intervals in a peripheral or circumferential direction thereof while surrounding the operation shaft 3. Also, the main guide grooves 49 are formed so as to be open to both the operation shaft 3 and the rearward side of the axial direction thereof. Further, the guide member 45 is formed with four secondary guide grooves 59. The secondary guide grooves 59 each are arranged so as to be positioned between each adjacent two of the four primary guide grooves 57 and so as to extend in parallel to the axis of the operation shaft 3. Also, the secondary guide grooves 59 are arranged so as to be spaced at equal intervals from each other in the circumferential direction of the guide member 45 and therefore the operation shaft 3 and formed in a manner to be open to both the operation shaft 3 and the rearward side of the axial direction. In addition, the guide body 49 of the guide member 45 is provided on an end thereof defined on the rearward side of the operation shaft 3 with a plurality of guide surfaces 61 in a manner to be positioned between the main guide grooves 57 adjacent to each other. The guide surfaces 61 include first to third surfaces 61*a* to 61*c*. The first surface 61*a* is formed so as to be contiguous to an opening 57*a* (FIG. 6A) of one of adjacent two of the primary guide grooves 57 which is defined on the rearward side of the axial direction of the operation shaft 3. The first surface 61*a* is also formed so as to be inclined from a side thereof facing the one of the two primary guide grooves 57 to a side thereof facing the other of the adjacent two primary guide grooves 57 while extending toward the forward side of the axial direction or a side of the operation section 9. Thus, the first surface 61*a* has a terminal end defined at an edge of the secondary groove 59 positioned between the two primary guide grooves 57 which faces the other primary guide groove 57. The second surface 61*b* is formed so as to extend from the terminal end of the first surface 61*a* toward the rearward side of the axial direction and in parallel to the operation shaft 3. Thus, the second surface 61*b* has an initial end defined on a side of the terminal end of the first surface 61*a* and a terminal end defined opposite to the initial end. The third surface 61*c* is formed so as to be inclined from the terminal end of the second surface 61*b* toward the other of the two primary guide grooves 57 while extending toward the forward side of the axial direction and so as to be contiguous to an opening of the other of the two primary guide grooves 57. The first surface 61*a* and third surface 61*c* each are formed into an arcuate shape when being viewed from the rearward side of the axial direction, as shown in FIG. 6C.

Figure 7A:
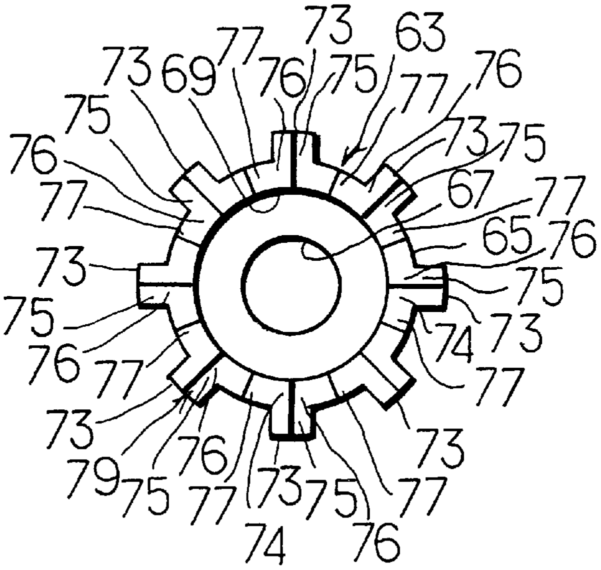
FIG. 7A is a plan view showing a slide member.
Figure 7B:
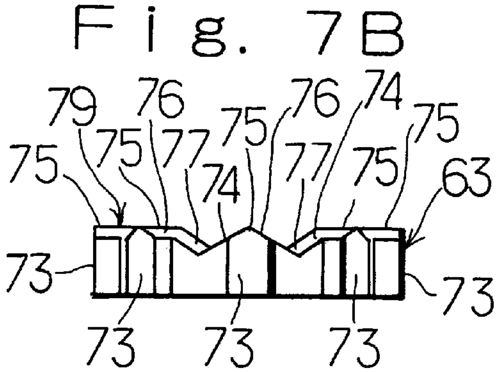
FIG. 7B is a front elevation view of the slide member shown in FIG. 7A.
Figure 7C:
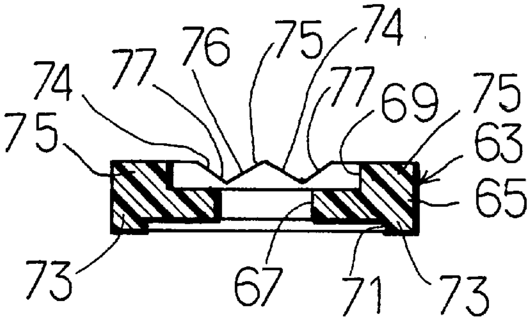
FIG. 7C is a sectional view of the slide member shown in FIG. 7A.

Reference numeral 63 designates a slide member made of synthetic resin and formed into an outer configuration like a gear. The slide member, as shown in FIGS. 7A to 7C, includes a slide body 65 of an annular shape, which is formed at a central portion thereof with a through-hole 67 via or in which the end of the operation shaft 3 on the rearward side of the axial direction or the second end of the operation shaft 3 is loosely inserted or fitted. Also, the slide member 63 is formed on both ends thereof defined in an axial direction thereof with recesses 69 and 71. The slide body 65 of the slide member 63 is provided on an outer periphery thereof with eight projections 73 fitted in the four primary guide grooves 57 and four secondary guide grooves 59, respectively. The slide body 65 thus constructed is fitted in the guide member 45 in a manner to be axially movable. If the slide member 63 is prevented from being fitted in the guide member 45, the slide member 63 is rendered rotatable about the operation shaft 3. On the contrary, when the slide member 63 is kept fitted in the guide member 45, the slide member 63 may be moved with the operation shaft 3 in the axial direction thereof and pivotally moved about the operation shaft 3 in the peripheral or circumferential direction by an amount corresponding to a gap defined between the primary and secondary guide grooves 57, 59 and the projections 73. The slide member 63 is formed on an end surface thereof defined on the rearward side of the axial direction with an annular rugged surface section 79 constituted by eight protrusions 75 and eight recesses 77 alternately arranged at angular intervals of 22.5 degrees in the peripheral or circumferential direction thereof. In the illustrated embodiment, the protrusions 75 each are formed into a triangular projection in section and the recesses 77 each are formed into a triangular recess in section. The protrusions 75 are arranged so as to be positioned on the projections 73 and slide body 65 and the projections 73 are arranged on the slide body 65. If it is not required to rotate the operation shaft 3, the slide member 63 may be provided in a manner to be integral with the operation shaft 3. Unfortunately, this requires to increase a diameter of the operation shaft 3. A failure in an increase in diameter of the operation shaft 3 leads to a failure in an increase in size of the slide member 6 and renders assembling thereof troublesome. Also, when it is not required to rotate the operation shaft 3, the slide member 63 may be loosely fitted on the operation shaft 3. Such construction permits pivotal movement of the slide member 63 to minimize transmission of shock due to rotation of the rotary slider 81 to the operation shaft 3.

As shown in FIG. 4, the operation shaft 3 has a fit section 3*b*1 fitted in the slide member 63. Also, the operation shaft 3 has a forward section 3*b*2 positioned forwardly of the fit section 3*b*1 in the axial direction thereof. The fit section 3*b*1 is formed into a diameter smaller than the forward section 3*b*2, resulting in a stepped section being formed between the fit section 3*b*1 and the forward section 3*b*2. The thus-formed stepped section or an end surface of the operation shaft 3 defined on the rearward side thereof constitutes a stopper surface with which the end surface of the slide member 63 on the forward side of the axial direction thereof. Such construction permits the slide member to be moved with the operation shaft 3 even when the slide member 63 is loosely fitted on the operation shaft 3.

Figure 8A:
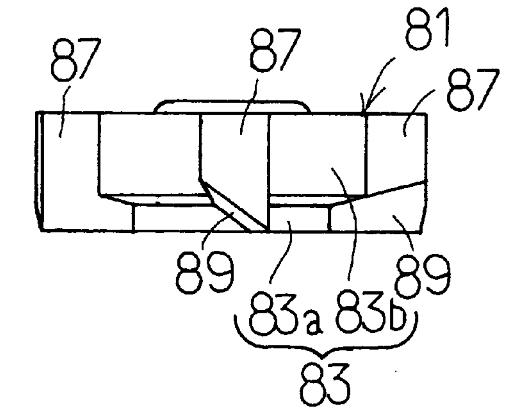
FIG. 8A is a front elevation view showing a rotary slider.
Figure 8B:
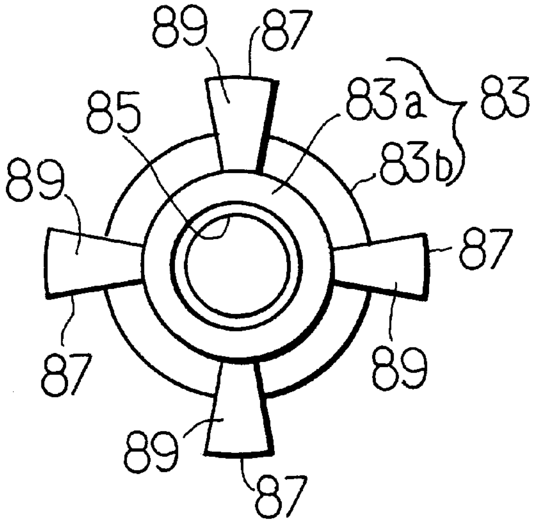
FIG. 8B is a bottom view of the rotary slider shown in FIG. 8A.
Figure 8C:
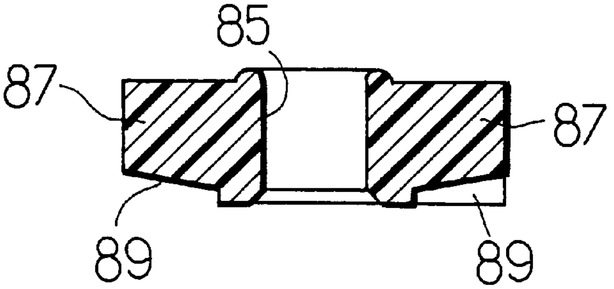
FIG. 8C is a sectional view of the rotary slider shown in FIG. 8A.

The operation shaft 3, as shown in FIGS. 3 and 4, is fitted on the end thereof on the rearward side of the axial direction thereof or the second end thereof with the rotary slider 81 in a manner to be rotatable therearound while being positioned rearwardly of the slider member 63. The rotary slider 81 is integrally formed of a synthetic resin material. The rotary slider 81, as shown in FIGS. 8A to 8C, includes a slider body 83 which is so formed that an annular small-diameter section 83*a* and a large-diameter section 83*b* which are formed at a central portion thereof with a common through-hole 85 in a manner to commonly extend in an axial direction thereof and arranged in juxtaposition to each other in the axial direction. The slider body 83 is integrally formed on an outer periphery thereof with four projections 87 which are fitted in the primary guide grooves 57 of the guide member 45, respectively. The projections 87 are arranged so as to be spaced from each other at an angular intervals of 90 degrees in the peripheral direction of the slider body 83. Also, as shown in FIGS. 8A to 8C, the projections 87 each are so formed that an end thereof defined on the forward side of the axial direction or a side of the slide member 63 extends from an outside thereof in a radial direction thereof to an outer periphery of the small-diameter section 83*a*. The projections 87 each are formed on an end surface thereof defined on the forward side of the axial direction with a contact surface section 89 contacted with the rugged surface section 79 of the slide member 45. The contact surface sections 89 each are inclined so as to extend toward the forward side of the axial direction of the operation shaft 3 while extending toward one side of a circumferential direction of the operation shaft 3 or in a direction of rotation of the rotary slider 81. More specifically, each of the contact surface sections 89 is so inclined that the projection 87 is increased in projecting distance or length thereof toward the front side of the operation shaft 3 or the side of the slide member 63 while extending in a clockwise direction in FIG. 8B. Thus, when the projections 87 are kept received in the primary guide grooves 57, the contact surface sections 89 each are kept contacted with an inclined surface 76 of each of the protrusions or triangular projections 75 positioned on one side of a peripheral direction thereof, which protrusions 75 are arranged on the projections 73 of the slider member 63 fitted in the primary guide grooves 57. The one side of the peripheral direction corresponds to a direction of rotation of the rotary slider 81 or a counter-clockwise direction in FIG. 7A. The rotary slider 81, as described below, is rotated in the clockwise direction around the operation shaft 3 as viewed from a side of the operation section 9, after it is moved toward the rearward side of the axial direction from the guide member 45. In the illustrated embodiment, it is rotated by about 22.5 degrees.

As shown in FIGS. 3 and 4, the operation shaft 3 is formed on the second end thereof or the end thereof on the rearward side of the axial direction thereof with an annular recess 3*c* open outwardly in a radial direction thereof. The annular recess 3*c* is fitted therein with a detachment preventing member 91. The detachment preventing member 91 is arranged on the rearward side of the axial direction of the operation shaft 3 based on the rotary slider 81 and fixed on the second end of the operation shaft, resulting in preventing detachment of the rotary slider 81 from the operation shaft 3. Thus, the detachment preventing member 91 prevents the operation shaft 3 from being detached or dislocated from the electric component body 5 on the forward side of the axial direction. The detachment preventing member 91, as shown in FIG. 5, may be constituted by a metal plate of a C-shape.

The operation shaft 3 is fitted on a distal portion of the second end thereof or the end thereof on the rearward side of the axial direction thereof with a spring holder 95 at which the spring member 93 is held at one end thereof. The spring holder 95 is integrally formed of a synthetic resin material and includes an annular flange 95*a* provided on an end thereof defined on the forward side of the axial direction. The spring member 39 is fitted at the one end thereof on the spring holder 95 while being abutted against the flange 95*a*. The spring holder 95 is contacted with the end surface of the rotary slider 81 defined on the rearward side of the axial direction so as to permit rotation of the rotary slider 81. Also, the spring holder 95 is formed on an end thereof facing the rotary slider 81 with a recess 95*b* for receiving the detachment preventing member 91 therein. The spring holder 95 thus constructed effectively prevents the spring member 93 from obstructing or interfering with rotation of the rotary slider 81. Also, the spring holder 95 minimizes an increase in length of the electric component in the axial direction. Further, the detachment preventing member 91 is kept from being contacted with the rotary slider 81, to thereby prevent the detachment preventing member 91 from interfering with rotation of the rotary slider 81.

The spring member 93 constantly generates force acting to urge the rotary slider 81 against the slide member 63. For this purpose, it is compressed to store the force when the operation section 3 of the operation shaft 3 is moved from the first position or operation position shown in FIG. 3 to the second position or received position shown in FIG. 4. In the illustrated embodiment, the spring member 93 is constituted by a coiled spring formed into a diameter which permits a forward end thereof to enter the guide member 45 together with the spring holder 45 when the operation section 9 is at the first position or operation position. The second receiving section 43*b* provided in the cover member 41 is formed into a configuration which restrains movement of the other end of the spring member 93 or a rearward end thereof.

Figure 9A:
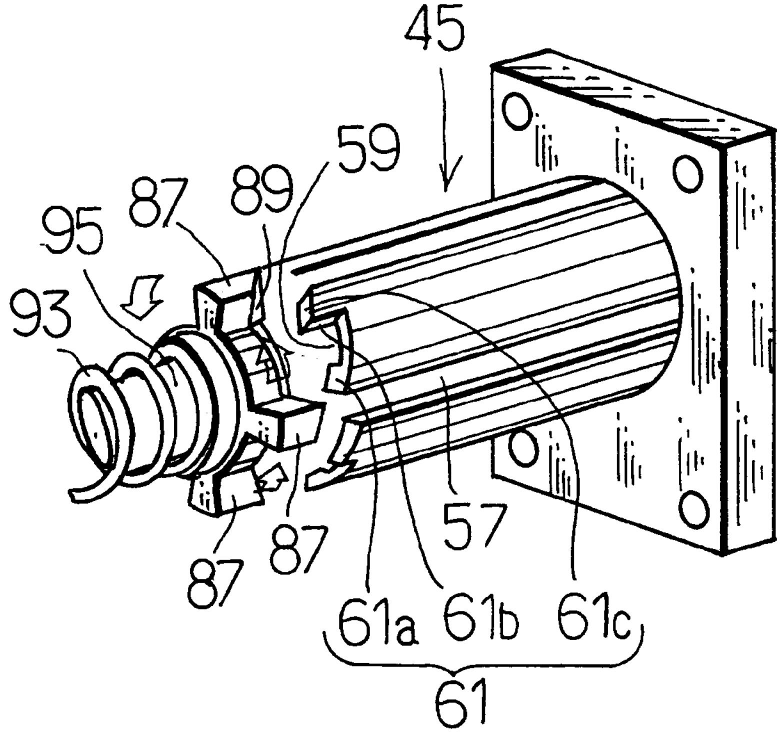
FIG. 9A is a schematic perspective view showing operation of rotation of a rotary slider.
Figure 9B:
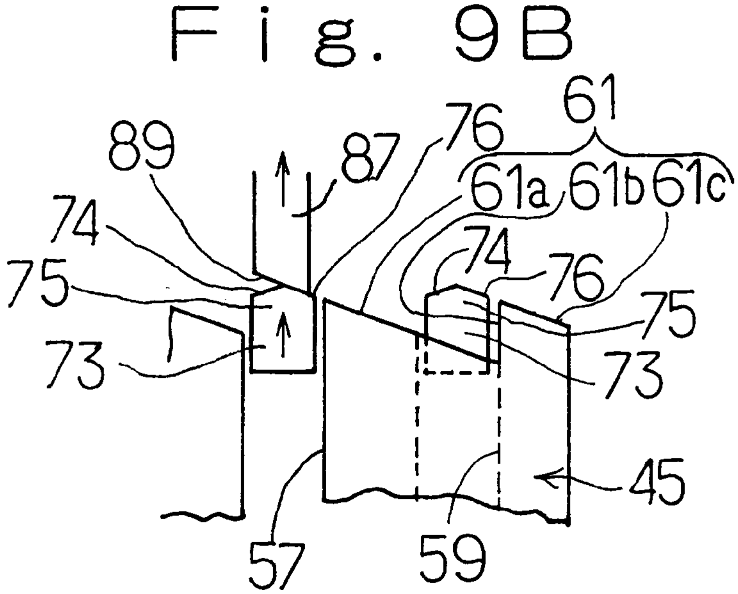
FIG. 9B is a fragmentary schematic view showing relationship among a contact surface provided on a projection of a rotary slider, an inclined surface of a protrusion provided on a projection of a slide member and a guide surface formed on an end of a guide member.

The projections 87 of the rotary slider 81, the contact surface sections 89 of the projections 87, and the triangular protrusion 75 and triangular recesses 77 of the rugged surface section of the slide member 63 each are formed into a configuration which permits the rotary slider 81 and slide member 63 to carry out operation as described hereinafter with reference to FIGS. 9*a* and 9B. First, force (locking force) which acts to move the operation section 9 of the operation shaft 3 from the first position or operation position shown in FIG. 3 to the second position or received position shown in FIG. 4 is applied to the operation section 9 of the operation shaft 3, during which the contact surface section 89 and one 76 of the inclined surfaces of the triangular protrusion 75 on the projection 73 fitted in each of the primary guide grooves 57 are kept contacted with each other while the projections are positioned in the primary guide grooved 57. Then, after the projection 87 is moved out of the primary guide groove 57, the contact surface section 89 is partially moved from the inclined surface 76 of the triangular protrusion 75 onto the first surface 61*a* of the guide member 45. Then, when the locking force is released, the contact surface section 89 is slid on the first surface 61*a* of the guide member 45 to engage the projection 87 with the second surface 61*b*. When the contact surface section 89 is partially moved from the inclined surface 76 onto the first surface 61*a* of the guide member 45 and when the contact surface section 89 is slid on the first surface 61*a,* force generated from the compressed spring member 93 to urge the rotary slider 81 toward the forward side of the axial direction is also used for rotation of the rotary slider 81. Release of the locking force permits elastic force of the spring member 93 to slightly displace the slide member 63 together with the operation shaft 3 and rotary slider 81 toward the forward side of the axial direction. Then, the projections 87 each are engaged with each of the second surfaces 61*b* of the guide member 45, to thereby prevent movement of the operation shaft 3 toward the forward side of the axial direction, so that the slide member 63 may be kept from being moved together with the operation shaft 3.

Then, the operation section 9 of the operation shaft 3 has release force or force of urging it toward the second position or received position applied thereto, during which the projection 87 is engaged with the second surface 61*b* of the guide member 45 and the contact surface section 89 is contacted with the inclined surface 76 of the triangular projection 75 of the projection 73 fitted in the secondary guide groove 59. Then, the projection 87 is moved to a position at which engagement between the projection 87 and the second surface 61*b* of the guide member 45 is released and then the contact surface section 89 is partially shifted from the inclined surface 76 of the triangular projection 75 onto the third surface 61*c*. Then, when the release force is released, the contact surface section 89 is slid on the third surface 61*c* of the guide member 45, to thereby permit the projection 87 to enter the primary guide groove 57 adjacent in the peripheral direction. At this time, rotation of the rotary slider 81 is carried out by means of elastic force of the spring member 93.

In the illustrated embodiment, the protrusions 75 each are formed into an equilateral triangle in section. Now, relationship between the contact surface section 89 of the projection 87 of the rotary slider 81 and the inclined surface 76 of the protrusion 75 formed on the rugged surface section 79 of the slide member will be described more detailedly. When the contact surface section 89 is moved to the first surface 61*a* and when it is moved onto the third surface 61*c,* the inclined surface 76 of the protrusion 75 positioned on a side of the direction of rotation of the rotary slider 81 or on one side of the peripheral or circumferential direction of the operation shaft 3 is contacted with the contact surface section 89. The contact surface section 89 gets over an inclined surface 74 which is the other one of the inclined surfaces of the protrusion 75 of the projection 73 fitted in the secondary guide groove 59 which is positioned on the other side of the peripheral direction or on a side opposite to the rotation direction of the rotary slider 81, to thereby be contacted with the inclined surface 76 on one side of the peripheral or circumferential direction in the course of engagement of the projection 87 with the second surface 61*b* of the guide member 45. Also, in the course of fitting of the projection 87 in the different primary guide groove 57, the contact surface section 89 gets over the inclined surface 74 of the protrusion 75 of the projection 73 fitted in the primary guide groove 57 which is positioned on the other side of the peripheral direction or the side opposite to the rotation direction of the rotary slider 81, to thereby be contacted with the inclined surface 76 on one side of the peripheral direction.

In the illustrated embodiment, the guide member 45, slide member 63, rotary slider 81 and spring holder 95 each are made of a synthetic resin material reduced in surface friction resistance such as polyacetal, polycarbonate or the like.

Also, in the illustrated embodiment, the guide member 45 is arranged so as to be held stationary with respect to the second casing member, to thereby keep shock generated due to rotation of the rotary slider 81 from being transmitted directly to contacts of the electric component unit through the second casing member. Also, the slide member 63 is permitted to be pivotally moved within a predetermined angular range, to thereby minimize transmission of vibration due to rotation of the rotary slider 81 to the electric component unit. Further, the illustrated embodiment is so constructed that the operation shaft 3 is pivotally moved with respect to the slide member 63 and rotary slider 81 without rotation of the guide member 45. Thus, application of rotating force to the operation section during lock operation or release operation does not affect the operation. This ensures positive lock and release of the operation shaft.

In addition, the electric component of the illustrated embodiment may be mounted on the circuit board CB while permitting a part of the electric component to be projected on a side of a rear surface of the circuit board CB and extending the operation shaft 3 in a direction perpendicular to a front surface of the circuit board CB. This permits a distance between the circuit board CB and an operation panel to be reduced when the circuit board CB is fixed in parallel to the operation panel, to thereby permit an internal space of the electric component to be available.

The present invention may be applied to an electric component unit including one of a toggle switch, a push switch, a rotary switch, a variable capacitor, a variable resistor and the like, as well as any combination thereof.

As can be seen from the foregoing, the present invention is constructed so as to permit the single spring member to attain both lock operation and release operation, resulting in reducing the number of parts required and simplifying a structure of the electric component. Also, in the present invention, the rotary slider is held stationary, to thereby prevent shock due to rotation of the rotary slider from being transmitted directly to contacts of the electric component unit through the guide member, resulting in substantially preventing occurrence of noise. In addition, the present invention is so constructed that the guide member is held stationary and the operation shaft is pivotally moved with respect to the slide member and rotary slider. This prevents application of rotating force to the operation section during lock operation or release operation from affecting the operations, to thereby ensure satisfactory lock and release of the operation shaft. Further, in the present invention, the slide member may be pivotally moved within a predetermined angular range about the operation shaft. This prevents vibration due to rotation of the rotary slider from being transmitted to the operation shaft, to thereby further reduce noise.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An operation shaft receiving-type electric component comprising:

an operation shaft having a first end defined on a forward side of an axial direction thereof and a second end defined on a rearward side of said axial direction and including an operation section provided on a side of said first end;

an electric component body arranged between said operation section and said second end of said operation shaft and including a casing in which an electric component unit varied in electric properties due to displacement of said operation shaft is received; and a push-type lock and release mechanism provided with respect to said second end of said operation shaft projected from said casing of said electric component body;

said push-type lock and release mechanism being arranged so as to keep said second end of said operation shaft locked when force acting to move said operation section of said operation shaft from a first position away toward said forward side of said axial direction from said casing to a second position in proximity to said casing is applied to said operation section of said operation shaft to move said operation shaft toward said rearward side of said axial direction, followed by release of the force and so as to release the lock of said second end of said operation shaft when force acting to move said operation section of said operation shaft locked to said second position is applied to said operation section of said operation shaft, followed by release of the force;

said push-type lock and release mechanism including a guide member, a slide member, a rotary slider, a detachment preventing member and a spring member;

said guide member being held stationary while being arranged concentrically with said operation shaft and including primary guide grooves of n (n: an integer of 2 or more) in number arranged in a manner to extend in parallel to an axis of said operation shaft, be spaced from each other at equal intervals in a circumferential direction of said operation shaft while surrounding said operation shaft and be open to both said operation shaft and said rearward side of said axial direction thereof, secondary guide grooves of n in number arranged so as to be positioned between each adjacent two of said primary guide grooves, extend in parallel to said axis of said operation shaft, be spaced at equal intervals from each other in said circumferential direction and be open to both said operation shaft and said rearward side of said axial direction, and a plurality of guide surfaces formed on an end thereof defined on said rearward side of said axial direction in a manner to be positioned between said primary guide grooves adjacent to each other;

said guide surfaces including a first surface formed so as to be contiguous to an opening of one of adjacent two of said primary guide grooves which is defined on said rearward side of said axial direction and formed so as to be inclined from a side thereof facing said one of said adjacent two primary guide grooves to a side thereof facing the other of said adjacent two primary guide grooves while extending toward said forward side of said axial direction, resulting in having a terminal end defined at an edge of the secondary groove positioned at a side of the other of said adjacent two primary guide grooves, a second surface formed so as to extend from said terminal end of said first surface toward said rearward side of said axial direction and have an initial end defined on a side of said terminal end of said first surface and a terminal end defined opposite to said initial end, and a third surface formed so as to be inclined from said terminal end of said second surface toward said the other of said adjacent two primary guide grooves while extending toward said forward side of said axial direction and so as to be contiguous to an opening of said the other of said two primary guide grooves;

said slide member being provided with projections of 2n in number fitted in said primary guide grooves and secondary guide grooves and fitted in said guide member so as to be movable in said axial direction, resulting in being movable with said operation shaft in said axial direction;

said slide member being formed on an end surface thereof defined on said rearward side of said axial direction with an annular rugged surface section constituted by protrusions of 2n in number and recesses of 2n in number alternately arranged at predetermined angular intervals, said protrusions being arranged so as to be positioned on said projections and including inclined surfaces;

said rotary slider being provided with projections of n in number fitted in said primary guide grooves and arranged on said rearward side of said operation shaft based on said slide member so as to be pivotally fitted on said second end of said operation shaft;

said projections of said rotary slider each being formed on an end surface thereof defined on said forward side of said axial direction with a contact surface section contacted with said rugged surface section of said slide member;

said detachment preventing member being arranged on said rearward side of said operation shaft based on said rotary slider and fixed on said second end of said operation shaft, resulting in preventing detachment of said rotary slider from said operation shaft;

said spring member being arranged so as to constantly generate force acting to urge said rotary slider against said slide member and compressed to store said force when said operation section of said operation shaft is moved from said first position to said second position;

said projections of said rotary slider, said contact surface sections of said projections, and said protrusions and recesses of said rugged surface section of said slide member each being formed into a configuration which is determined so as to permit locking force which acts to move said operation section of said operation shaft from said first position to said second position to be applied to said operation section of said operation shaft, during which said contact surface section and one of said inclined surfaces of said protrusion on said projection fitted in each of said primary guide grooves are kept contacted with each other while said projections are positioned in said primary guide grooves, said contact surface section is partially moved from said inclined surface of said protrusion onto said first surface of said guide member after said projection is moved out of said primary guide groove, and said contact surface section is slid on said first surface of said guide member to engage said projection with said second surface when said locking force is released;

said configuration being also determined so as to permit release force which acts to urge said operation section of said operation shaft toward the second position to be applied to said operation section of said operation shaft, during which said projection is engaged with said second surface of said guide member and said contact surface section is contacted with said inclined surface of said protrusion of said projection fitted in said secondary guide groove, said contact surface section is partially shifted from said inclined surface of said protrusion onto said third surface after said projection is moved to a position at which engagement between said projection and said second surface of said guide member is released and said contact surface section is slid on said third surface of said guide member, to thereby permit said projection to enter the other of said adjacent two primary guide grooves adjacent in the circumferential direction when said release force is released.

2. An operation shaft receiving-type electric component as defined in claim 1, wherein said slide member is formed integrally with said operation shaft.

3. An operation shaft receiving-type electric component as defined in claim 1, wherein said slide member is loosely fitted on said operation shaft.

4. An operation shaft receiving-type electric component as defined in claim 1, wherein said push-type lock and release mechanism is arranged in a cover member fixed with respect to said casing of said electric component body.

5. An operation shaft receiving-type electric component as defined in claim 1, wherein said guide member is provided separately from said cover member and includes a flange interposedly supported between said casing of said electric component body and said cover member.

6. An operation shaft receiving-type electric component as defined in claim 1, wherein said second end of said operation shaft is fitted on a distal portion thereof with a spring holder on which said spring holder is held at one end thereof; and said spring holder is contacted with an end surface of said rotary slider defined on said rearward side of said axial direction, to thereby permit rotation of said rotary slider.

7. An operation shaft receiving-type electric component as defined in claim 6, wherein said spring holder is formed at an end thereof facing said rotary slider with a recess in which said detachment preventing member is received.

8. An operation shaft receiving-type electric component as defined in claim 7, wherein said spring member comprises a coiled spring formed into a diameter which permits one end thereof defined on a side of said spring holder to enter said guide member together with said spring holder when said operation section is at said first position; and said cover member is formed therein with a receiving section for receiving the other end of said spring member therein so as to restrain movement of said the other end of said spring member.

9. An operation shaft receiving-type electric component as defined in claim 1, wherein said primary guide grooves of said guide member each are open outwardly in a radial direction of said operation shaft.

10. An operation shaft receiving-type electric component as defined in claim 1, wherein said electric component unit is a variable resistor unit.

11. An operation shaft receiving-type electric component as defined in claim 1, wherein said n is 4.

12. An operation shaft receiving-type electric component comprising:

an operation shaft having a first end defined on a forward side of an axial direction thereof and a second end defined on a rearward side of said axial direction and including an operation section provided on a side of said first end;

an electric component body fitted between said operation section and said second end of said operation shaft and including a casing, a rotor arranged in said casing so as to be rotated with said operation shaft and permit said operation shaft to be moved in said axial direction, a rotor support arranged in said casing so as to rotatably support said rotor, and an electric component unit including a rotated member and arranged in said casing, said rotated member being rotated by rotation of said rotor, leading to a variation in electric properties of said electric component unit; and a push-type lock and release mechanism provided with respect to said second end of said operation shaft projected from said casing of said electric component body;

said push-type lock and release mechanism being arranged so as to keep said second end of said operation shaft locked when force acting to move said operation section of said operation shaft from a first position away toward said forward side of said axial direction from said casing to a second position in proximity to said casing is applied to said operation section of said operation shaft to move said operation shaft toward said rearward side of said axial direction, followed by release of the force and so as to release the lock of said second end of said operation shaft when force acting to move said operation section of said operation shaft locked to said second position is applied to said operation section of said operation shaft, followed by release of the force;

said push-type lock and release mechanism including a guide member, a slide member, a rotary slider, a detachment preventing member and a spring member;

said guide member being held stationary with respect to said casing while being arranged concentrically with said operation shaft and including primary guide grooves of n (n: an integer of 2 or more) in number arranged in a manner to extend in parallel to an axis of said operation shaft, be spaced from each other at equal intervals in a circumferential direction of said operation shaft while surrounding said operation shaft and be open to both said operation shaft and said rearward side of said axial direction thereof, secondary guide grooves of n in number arranged so as to be positioned between each adjacent two of said primary guide grooves, extend in parallel to said axis of said operation shaft, be spaced at equal intervals from each other in said circumferential direction and be open to both said operation shaft and said rearward side of said axial direction, and a plurality of guide surfaces formed on an end thereof defined on said rearward side of said axial direction in a manner to be positioned between said primary guide grooves adjacent to each other;

said guide surfaces including a first surface formed so as to be contiguous to an opening of one of adjacent two of said primary guide grooves which is defined on said rearward side of said axial direction and formed so as to be inclined from a side thereof facing said one of said adjacent two primary guide grooves to a side thereof facing the other of said adjacent two primary guide grooves while extending toward said forward side of said axial direction, resulting in having a terminal end defined at an edge of the secondary groove positioned at a side of the other of said adjacent two primary guide grooves, a second surface formed so as to extend from said terminal end of said first surface toward said rearward side of said axial direction and have an initial end defined on a side of said terminal end of said first surface and a terminal end defined opposite to said initial end, and a third surface formed so as to be inclined from said terminal end of said second surface toward said the other of said adjacent two primary guide grooves while extending toward said forward side of said axial direction and so as to be contiguous to an opening of said the other of said two primary guide grooves;

said slide member being provided with projections of 2n in number fitted in said primary guide grooves and secondary guide grooves and fitted in said guide member so as to be movable in said axial direction, resulting in being movable with said operation shaft in said axial direction;

said slide member being formed with a through-hole via which said second end of said operation shaft is pivotally inserted formed on an end surface thereof defined on said rearward side of said axial direction with an annular rugged surface section constituted by protrusions of 2n in number and recesses of 2n in number alternately arranged at predetermined angular intervals, said protrusions being arranged so as to be positioned on said projections and each of said protrusions having two inclined surfaces;

said rotary slider being provided with projections of n in number fitted in said primary guide grooves and arranged on said rearward side of said operation shaft based on said slide member so as to be pivotally fitted on said second end of said operation shaft;

said projections of said rotary slider each being formed on an end surface thereof defined on said forward side of said axial direction with a contact surface section inclined so as to extend toward said forward side of said axial direction while extending toward said one side of said circumferential direction and contacted with said rugged surface section of said slide member;

said detachment preventing member being arranged on said rearward side of said operation shaft based on said rotary slider and fixed on said second end of said operation shaft, resulting in preventing detachment of said slide member and rotary slider from said operation shaft;

said spring member being arranged so as to constantly generate force acting to urge said rotary slider against said slide member and compressed to store said force when said operation section of said operation shaft is moved from said first position to said second position;

said projections of said rotary slider, said contact surface sections of said projections, and said protrusions and recesses of said rugged surface section of said slide member each being formed into a configuration which is determined so as to permit locking force which acts to move said operation section of said operation shaft from said first position to said second position to be applied to said operation section of said operation shaft, during which said contact surface section and one of said two inclined surfaces of said protrusion on said projection fitted in each of said primary guide grooves are kept contacted with each other while said projections are positioned in said primary guide grooves, said contact surface section is partially moved from said one of said two inclined surfaces of said protrusion onto said first surface of said guide member after said projection is moved out of said primary guide groove, and said contact surface section is slid on said first surface of said guide member to engage said projection with said second surface when said locking force is released, said one of said two inclined surfaces of said protrusion being defined on said one side of said circumferential direction, the other of said two inclined surfaces of said protrusion being defined on the other side of said circumferential direction;

said configuration being also determined so as to permit release force which acts to urge said operation section of said operation shaft toward the second position to be applied to said operation section of said operation shaft, during which said projection is engaged with said second surface of said guide member and said contact surface section is contacted with said one of said two inclined surfaces of said protrusion of said projection fitted in said secondary guide groove, said contact surface section is partially shifted from said inclined surface of said protrusion onto said third surface after said projection is moved to a position at which engagement between said projection and said second surface of said guide member is released and said contact surface section is slid on said third surface of said guide member, to thereby permit said projection to enter the other of said adjacent two primary guide grooves adjacent in the circumferential direction when said release force is released;

said configuration being further determined so that said contact surface section gets over the other of said two of inclined surfaces of said protrusion of said projection fitted in said secondary guide groove, to thereby be contacted with said one of said two inclined surfaces in the course of engagement of said projection with said second surface of said guide member and said contact surface section gets over the other of said two of inclined surfaces of said protrusion of said projection fitted in said primary guide groove, to thereby be contacted with said one of said two inclined surfaces in the course of fitting of said projection in the other of said adjacent two primary guide grooves.

13. An operation shaft receiving-type electric component as defined in claim 12, wherein said slide member is loosely fitted on said operation shaft.

14. An operation shaft receiving-type electric component as defined in claim 12, wherein said operation shaft is formed at a first portion thereof on which said slide member is fitted into a diameter smaller than that of a second portion thereof positioned forwardly of said first portion in said axial direction; and said second portion having an end surface positioned on said rearward side of said axial direction, said end surface of said second portion constituting a stopper surface contacted with an end surface of said slide member defined on said forward side of said axial direction.

15. An operation shaft receiving-type electric component as defined in claim 12, wherein said push-type lock and release mechanism is arranged in a cover member fixed with respect to said casing of said electric component body.

16. An operation shaft receiving-type electric component as defined in claim 12, wherein said guide member is provided separately from said cover member and includes a flange interposedly supported between said casing of said electric component body and said cover member.

17. An operation shaft receiving-type electric component as defined in claim 12, wherein said second end of said operation shaft is fitted on a distal portion thereof with a spring holder on which said spring holder is held at one end thereof; and said spring holder is contacted with an end surface of said rotary slider defined on said rearward side of said axial direction, to thereby permit rotation of said rotary slider.

18. An operation shaft receiving-type electric component as defined in claim 12, wherein said primary guide grooves of said guide member each are open outwardly in a radial direction of said operation shaft.

19. An operation shaft receiving-type electric component as defined in claim 12, wherein said guide member, slide member and rotary slider each are made of synthetic resin reduced in surface frictional resistance.

20. An operation shaft receiving-type electric component as defined in claim 12, wherein said n is 4.

21. An operation shaft receiving-type electric component as defined in claim 12, wherein said projections of said slide member each are formed into an equilateral triangle in section.

* * * * *

UNITED STATES PATENT AND TRADEMARK OFFICE

CERTIFICATE OF CORRECTION

PATENT NO. : 5,991,149

DATED : November 23, 1999

INVENTOR(S) : Tsuneaki et al.

It is certified that error appears in the above-indentified patent and that said Letters Patent is hereby corrected as shown below:

On the Title Page, Section [54], after "ELECTRIC" insert --COMPONENT--.

Column 1, Line 2, after "ELECTRIC" insert --COMPONENT--.

Signed and Sealed this

Twenty-seventh Day of June, 2000

Attest:

Q. TODD DICKINSON

Attesting Officer

*Director of Patents and Trademarks*